United States Patent
Kaufman

[11] 4,091,279
[45] May 23, 1978

[54] METHOD AND MEANS FOR EQUALIZING THE SENSITIVITY OF A MULTI-ELEMENT SENSOR ARRAY

[75] Inventor: Irving Kaufman, Tempe, Ariz.

[73] Assignee: The United States of America as represented by the Secretary of the Air Force, Washington, D.C.

[21] Appl. No.: 669,543

[22] Filed: Mar. 23, 1976

[51] Int. Cl.$^2$ .......................... G02F 1/01; H01J 39/12
[52] U.S. Cl. ...................... 250/225; 350/150
[58] Field of Search ............ 250/225, 237 R; 350/150; 340/173.2

[56] References Cited

U.S. PATENT DOCUMENTS

| | | | |
|---|---|---|---|
| 3,612,656 | 6/1969 | Maldonado et al. | 350/150 |
| 3,680,060 | 7/1972 | Keneman et al. | 350/150 |
| 3,926,520 | 12/1975 | Kaufman | 250/225 |

*Primary Examiner*—Alfred E. Smith
*Assistant Examiner*—David K. Moore

*Attorney, Agent, or Firm*—Joseph E. Rusz; Willard R. Matthews, Jr.

[57] ABSTRACT

Equalization and the individual control of the sensitivity of each element in a multi-element sensor array is achieved by means of a light transmitting element positioned to intercept light falling on the light receiving surface of each sensor element. Structurally the light transmitting device can be a single sheet of transparent ferroelectric ceramic having a long term polarization retention capability (or memory). A discrete portion of the sheet adjacent each sensor element is polarized in a manner that controls the level of light transmitted through the sheet at that locus and so controls the output level of the sensor adjacent to it. Equalization of sensor elements is accomplished by setting the polarization of each light transmitting element as a function of the difference between its associated sensor output voltage level and a standard voltage level in response to a constant intensity light source.

4 Claims, 5 Drawing Figures

METHOD AND MEANS FOR EQUALIZING THE SENSITIVITY OF A MULTI-ELEMENT SENSOR ARRAY

STATEMENT OF GOVERNMENT INTEREST

The invention described herein may be manufactured and used by or for the Government for governmental purposes without the payment of any royalty thereon.

BACKGROUND OF THE INVENTION

This invention relates to multi-element sensor arrays and in particular to a method and means for equalizing the outputs of the individual sensor elements of such an array.

The method of equalizing the sensitivity of the many sensors of a sensor array comprehended by the invention is particularly applicable to systems that have the function of sensing images in ultraviolet, visible and infrared regions. A typical application would be an array of $m \times n$ elements in which each element produces an output that is a function of the illumination falling on it. This illumination could be broadband, i.e., ranging anywhere from ultraviolet through infrared; or it could be narrow-band and encompass, for example, only a narrow portion of the infrared spectrum.

The response of this illumination could be photoconducting, photovoltaic, or any other type. Ultimately the response would be converted to an electrical signal (i.e., a voltage level).

A problem that exists in such a sensor array is that while each element will sense the illumination and convert it to an electrical signal (voltage level), the response of the different elements may be different, i.e., the sensitivity is not the same. Moreover, the sensitivity of each element may change with age. It is desirable, therefore, to devise a method of equalizing the sensitivities of the various elements.

For an array that has only a few elements (say of the order of 10 - 100) a simple way of equalizing the response of the several elements would be to use a constant intensity light source (of the intensity that is in the range of interest), illuminate each element in turn with the light source, and, for each element, set the gain of a variable gain transistor amplifier connected to the sensor output to give a constant output. The transistor amplifier output voltage would be measured as the sensor is illuminated with the standard level of illumination. The output of the transistor amplifier bias supply would then be varied, thereby varying the gain of the variable gain amplifier until the output level has reached a standard value. This standardization procedure would be repeated for each of the sensor elements.

While this technique is satisfactory for an array of discrete elements that are relatively few in number, it is of course out of the question for an integrated array of many (say 100,000) sensor elements. It is the standardization of such an integrated multi-element sensor array system to which the invention addresses itself.

SUMMARY OF THE INVENTION

The invention comprehends a method and means that achieves individual sensor element sensitivity control and sensor array equalization by placing a transparent sheet member in light intercepting relationship with the light receiving surfaces of the sensor elements. The polarization characteristics of the portion of the sheet member adjacent each sensor element are selectively set. The polarization characteristics control the amount of light transmitted to the sensor element and hence control the sensor element output. The sheet member can be fabricated of a ferroelectric ceramic material or any suitable transparent material having a long term polarization retention capability (or memory). The invention utilizes two modes of operation. The first controls light transmission by using a coarse grained ferroelectric ceramic that exhibits a change in light scattering in response to changes in polarization. The second uses a fine grained ferroelectric ceramic that exhibits a change in birefringence in response to change in polarization. The equalization method of the invention comprehends positioning the sheet member adjacent to the array, illuminating the sheet member with constant intensity illumination, testing each sensor element by comparing its output voltage level with a standard voltage level, and fixing the polarization characteristics of the portion of the sheet member adjacent to the sensor element being tested as a function of the difference between the sensor element's output voltage level and the standard voltage level.

It is a principal object of the invention to provide a new and improved method of equalizing the responses of the individual sensor of a multi-element sensor array.

It is another object of the invention to provide a new and improved multi-element sensor array having an individual sensor element sensitivity setting capability.

These, together with other objects, features and advantages of the invention, will become more apparent from the following detailed description when taken in conjunction with the illustrative embodiments in the accompanying drawings.

DETAILED DESCRIPTION OF THE PREFERRED EMBODIMENTS

The sensor array equalization method and means comprehended by the invention makes use of a transparent material whose transmission (or effective transmission) can be varied by an applied voltage and, moreover, that has a long term polarization retention capability or "memory". Certain ferroelectric ceramic materials have been found to exhibit these characteristics. A particular example is the material designated PLZT, a transparent ferroelectric ceramic that was developed by Sandia Corporation. Certain ferroelectric ceramic materials (and particularly Sandia Corporation's PLZT) have been found to have at least two other distinct properties, either one of which could be used in practicing the invention. These are:

1. Fine grained ceramic (PLZT) has a birefringence whose amount is controlled by the polarization (electric dipole moment per unit volume) of the material. At a particular time, the direction and magnitude of this polarization, in turn, is determined by the past history of the material, and principally by electric fields that were applied to the material at some prior time.

Figure 1A:
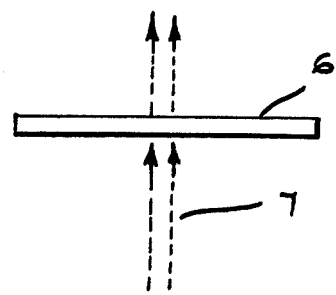
FIGS. 1a and 1b illustrate, schematically, the scattering of light by coarse-grained transparent ferroelectric ceramic material.
Figure 1B:
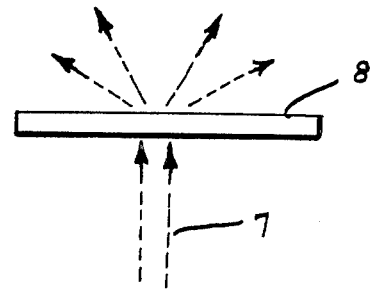
Figure 2:
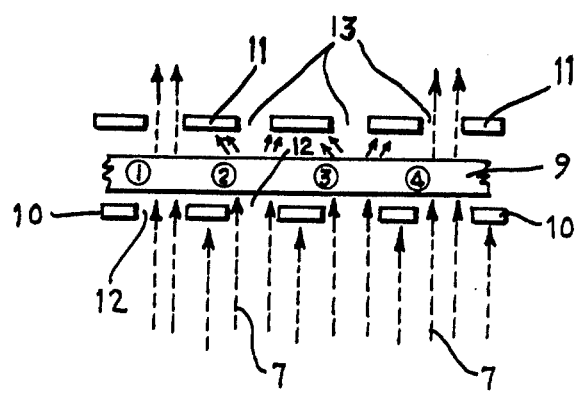
FIG. 2 illustrates an element defining iris arrangement adapted to use with the coarse grained ferroelectric ceramic material of FIGS. 1a and 1b.

2. Coarse grained ceramic (PLZT) exhibits a scattering pattern of radiation whose direction is controlled by the polarization. This scattering effect is illustrated by the schematic representations of FIGS. 1a and 1b. Referring to FIG. 1a, the polarization of coarse grained element 6 is of a magnitude and direction such that light 7 is forward scattered in a straight ahead manner; alternatively the polarization of coarse grained element 8 of FIG. 1b is of a magnitude and direction such that light 7 is forward scattered at a large angle. Thus, for one magnitude and direction of polarization, light that shines through the material is essentially scattered forward. For another magnitude and direction of polarization, the light is scattered to the side.

It is apparent, therefore, that the material polarization may be used to control the effective amount of transmitted light. By using a small iris immediately in front of each element, the amount of light transmitted through the iris can be controlled by the polarization of the material. Thus, light opaque members 10 and 11 have irises 12 and 13 respectively that define four "elements" in coarse grained PLZT plate 9. In this instance the polarization pattern is for maximum transmission through elements No. 1 and No. 4 and zero transmission through elements No. 2 and No. 3.

Figure 3:
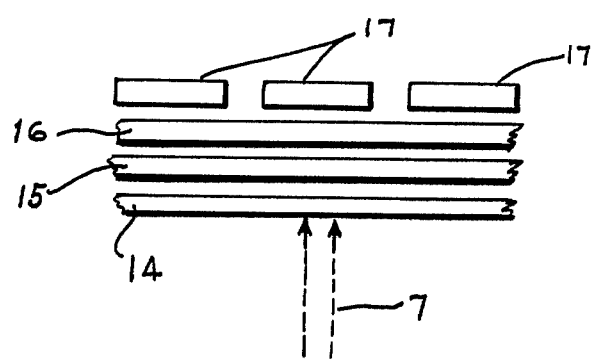
FIG. 3 illustrates an arrangement of filters and polarizers utilized to control light by means of the birefringent properties of fine grained ferroelectric ceramic material.

For the material whose birefringence is controlled by the material polarization, the transmission can be controlled in the manner that is now standard for such materials. The arrangement of components necessary to accomplish this is shown in FIG. 3. The incident light 7 is first filtered by filter means 14 so that light having only one type of electric field polarization is allowed to enter the system (say, vertical polarization of the E-field). This polarized light then passes through fine grained PLZT plate 15. At the output, between PLZT plate 15 and array sensor elements 17 there is placed a polarizer 16 that permits only light to pass out whose E-field is orthogonal to the entering E-field. Because of the birefringence of the PLZT sheet material for certain combinations of birefringence and path length, anywhere from zero to all the light is allowed to pass through the output polarizer 16. The point here is that the birefringence of the material (say, PLZT) depends on the polarization of the material. Consequently, by controlling the material polarization, it is again possible to control the light permitted to pass.

While ferroelectrics have been used to control light in this manner (using birefringence) for many years, the important feature of a material such as PLZT is that a pattern of material polarization over an extended area of a plate may be "stored" (by proper manipulation of the past history of applied electric fields), with great detail in the pattern. Consequently, the information that is essentially the pattern of a picture can be stored in the PLZT plate. This picture can then be reproduced by proper illumination and polarizing filters for the fine-grain materials, or by illumination, with somewhat less detail, for the coarse-grained materials. Current state-of-the-art experience indicates that such a material polarization pattern can be stored in a ferroelectric transparent ceramic plate for greater than a year and a picture corresponding to this pattern can then be reproduced by proper illumination and filtering.

Figure 4:
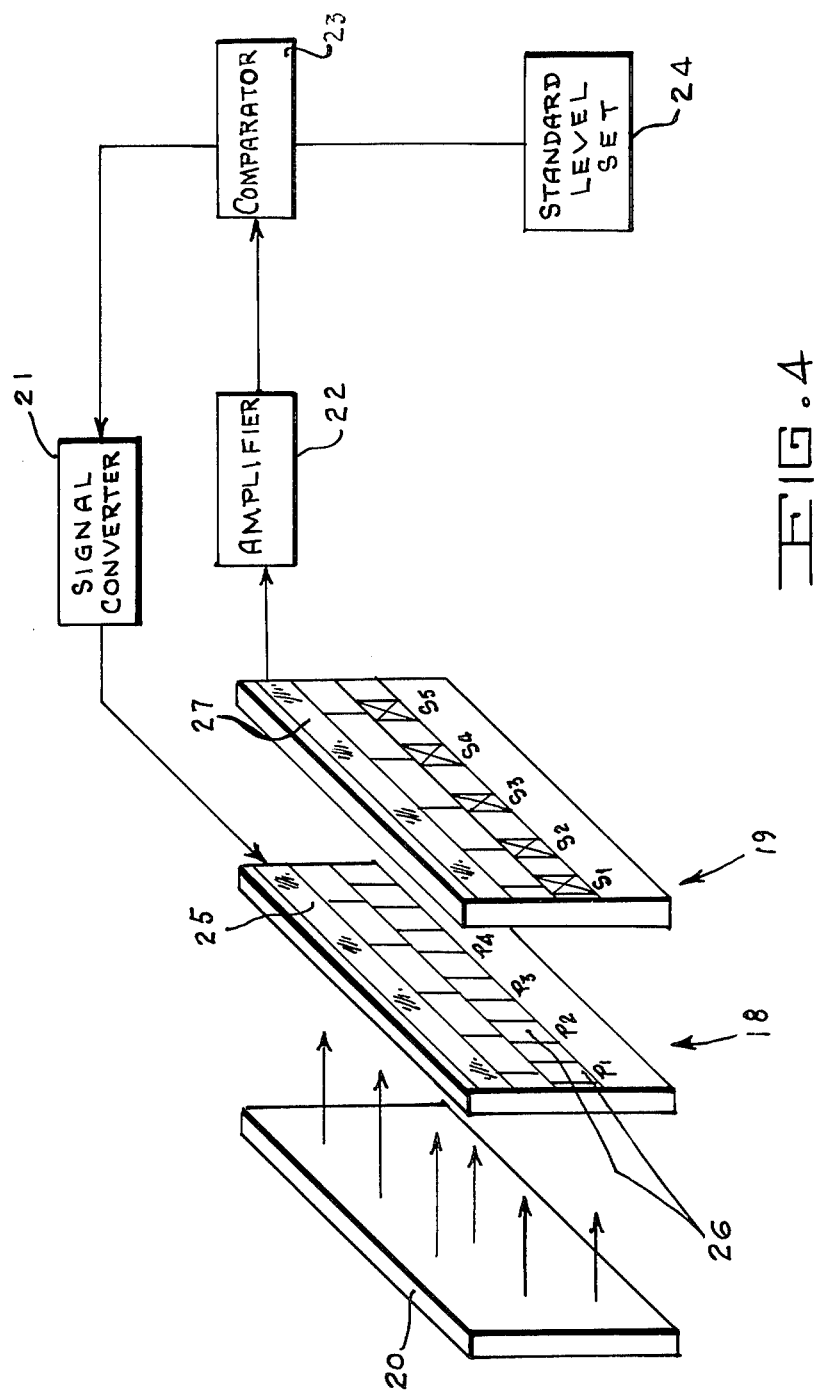
FIG. 4 illustrates the apparatus and arrangement utilized in equalizing the outputs of the sensor elements of a multi-element sensor array in accordance with the principles of the invention.

In view of the foregoing it is apparent how a PLZT plate can be used to equalize the outputs of the various sensors of a sensor array. FIG. 4 which illustrates a one-dimensional display shows one means for accomplishing equalization. Although the invention is hereinafter described having reference to this arrangement, the concepts disclosed are of course also readily extended to two-dimensional displays. The apparatus of FIG. 4 comprises constant intensity light source 20 emitting parallel light, ferroelectric ceramic sheet member 18, sensor array 19, and the signal comparing and polarization setting circuits consisting of signal converter 21, comparator 23, amplifier 22 and voltage standard 24.

As indicated in FIG. 4, a strip 18 of transparent ferroelectric ceramic material (PLZT) is placed immediately in front of sensor array 19. Transparent segmented electrodes 26 are applied to both the PLZT strip 18 and the sensor array plate 19 so that the PLZT plate 18 and the sensor array plate 19 can be considered as having a number of "elements", where each "element" has electrodes connected to it. The elements in plate 18 are designated as $P_1$, $P_2$, the corresponding ones in array plate 19 as $S_1$, $S_2$. By proper positioning and patterning, element $P_n$ is put immediately in front of element $S_n$. All elements in PLZT plate 18 are connected to a shift register 25; all elements in sensor array plate 19 are connected to a shift register 27. During sensitivity equalization, these shift registers are arranged so that when element $P_n$ is connected to the common input of register 25, element $S_n$ is connected to the common input of register 27. To equalize the sensitivities of the various elements, a choice of the standardized output level is made corresponding to the level of illumination used to perform the standardization, or equalization. If all the sensors are of nearly equal sensitivity, this "standard output level" would be the output of the least sensitive of the elements. This could be determined by a search technique, probably automatically.

The equalization then consists of illuminating the array with constant intensity illumination from constant intensity light source 20 and scanning sensor array 19. As any one element, say $S_n$, is scanned, the output level of the element is compared to the "standard" level that was previously set. The amplitude of the difference between the output level of that element and the "standard" level is then used to control the amplitude of a voltage pulse, or pulses, applied across the electrodes of element $P_n$ of the PLZT plate 18 to set the material polarization (electric dipole moment per unit volume) in amplitude and direction so that the effective transmission through the element $P_n$ becomes the standard level. This transmission control could occur through either the scattering mode or birefringent mode discussed above.

After this procedure, i.e., the setting of the polarizations of all the elements has been completed, the effective sensitivity of all the elements has been equalized, at least for one level of illumination. The circuit is then switched so that no comparison to any "standard level" is made; i.e., the electrical connection to the PLZT plate 18 is removed. The output sensor array can then be used as a scanned sensor array, as intended; with the assurance that in the vicinity of a chosen level of illumination the sensitivities of the various elements are approximately equal.

The equalization procedure, which is seen to be nearly automatic and can therefore be applied to arrays having many elements (say, $10^5$), can be repeated whenever the sensitivities of the elements become suspect.

It may be necessary that the polarizations of all the PLZT elements be set equal before the equalization is carried out. This can be achieved by a standard depolarizing procedure (similar to the demagnetization of watches by an AC field) or by application of strong pulses to drive all elements to their remanent polarization values. It will have to be determined in each instance whether this remanent polarization should be in the plane of the PLZT in perpendicular to it, and whether another electrode (per element) is required.

Although the foregoing description has related only to equalization of the sensitivities of the elements of a sensor array, it is pointed out that the procedure could also be applied to a display array in which the individual elements have different luminance for the same power input.

While the invention has been described in its preferred embodiments, it is understood that the words which have been used are words of limitation and that changes within the purview of the appended claims may be made without departing from the scope and spirit of the invention in its broader aspects.

What is claimed is:

1. The method of equalizing the sensitivity of a multi-element sensor array comprising the steps of
    positioning a sheet member of transparent material having long term polarization retention capabilities adjacent to and in light intercepting relationship with the light receiving surfaces of said sensor elements,
    illuminating said sheet member with constant intensity illumination,
    testing each sensor element by comparing its output voltage level with a standard voltage level, and
    fixing the polarization characteristics of the portion of said sheet member adjacent to the sensor element being tested as a function of the difference between that sensor element's output voltage level and the standard voltage level.

2. The method of equalizing the sensitivity of a multi-element sensor array as defined in claim 1 including the initial step of depolarizing said sheet member.

3. A sensor array having individual sensor element sensitivity setting means comprising
    an array of sensor elements,
    a sheet member of transparent course grained ferroelectric ceramic material having long term polarization retention capabilities positioned adjacent to and in light intercepting relationship with the light receiving surfaces of said sensor elements,
    light opaque members disposed adjacent to said sheet member, said light opaque members defining a light transmitting iris for each sensor element, and
    means for selectively fixing the polarity characteristics of a discrete portion of said sheet member adjacent to each sensor element.

4. A sensor array having individual sensor element sensitivity setting means comprising
    an array of sensor elements,
    a sheet member of transparent fine grained ferroelectric ceramic material having long term polarization retention capabilities positioned adjacent to and in light intercepting relationship with the light receiving surfaces of said sensor element,
    a light filtering means positioned adjacent to and in light interception relationship with said sheet members,
    a light polorizer means positioned between said sheet member and said sensor element, and
    means for selectivity fixing the polarity characteristics of a discrete portion of said sheet member adjacent to each sensor element.

* * * * *